(12) United States Patent
Chang et al.

(10) Patent No.: US 9,379,112 B2
(45) Date of Patent: Jun. 28, 2016

(54) INTEGRATED CIRCUIT WITH TRANSISTOR ARRAY AND LAYOUT METHOD THEREOF

(71) Applicant: Taiwan Semiconductor Manufacturing CO., LTD., Hsinchu (TW)

(72) Inventors: Ching-Ho Chang, Hsinchu (TW);
Jaw-Juinn Horng, Hsinchu (TW);
Yung-Chow Peng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 12 days.

(21) Appl. No.: 14/192,121

(22) Filed: Feb. 27, 2014

(65) Prior Publication Data

US 2015/0241902 A1    Aug. 27, 2015

(51) Int. Cl.
| | |
|---|---|
| H01L 27/118 | (2006.01) |
| H01L 21/82 | (2006.01) |
| H01L 27/10 | (2006.01) |
| G05F 3/26 | (2006.01) |
| H01L 29/423 | (2006.01) |
| H01L 27/06 | (2006.01) |
| H01L 27/07 | (2006.01) |

(52) U.S. Cl.
CPC .............. *H01L 27/10* (2013.01); *G05F 3/262* (2013.01); *H01L 27/0617* (2013.01); *H01L 27/0705* (2013.01); *H01L 29/42376* (2013.01)

(58) Field of Classification Search
CPC .................... H01L 27/10; H01L 29/42376
USPC .......... 257/206, 272, 202; 438/129, 587, 598
See application file for complete search history.

(56) References Cited

U.S. PATENT DOCUMENTS

| | | | | |
|---|---|---|---|---|
| 7,652,520 | B2* | 1/2010 | Gatta | H01L 27/0705 327/436 |
| 8,134,188 | B2* | 3/2012 | Richardson | H01L 27/0207 257/202 |
| 8,654,591 | B2* | 2/2014 | Akaogi | G11C 8/08 365/185.11 |
| 2014/0008732 | A1* | 1/2014 | Hyvonen | H01L 27/088 257/390 |
| 2014/0043906 | A1* | 2/2014 | Yano | G11C 16/0483 365/185.11 |
| 2014/0355357 | A1* | 12/2014 | Tailliet | G11C 16/14 365/185.23 |

\* cited by examiner

*Primary Examiner* — Calvin Lee

(57) ABSTRACT

An integrated circuit includes a plurality of transistors. The transistors are electrically connected in series and with their respective gates tied together. The transistors are implemented within a transistor array. The transistors are electrically connected between a first reference terminal and a second reference terminal. A non-dominator part of the transistors adjacent to the first reference terminal are implemented at corner regions of the transistor array.

19 Claims, 6 Drawing Sheets

INTEGRATED CIRCUIT WITH TRANSISTOR ARRAY AND LAYOUT METHOD THEREOF

BACKGROUND

Integrated circuit design in the deep-submicron process (e.g., 32 nm, 20 nm, 16 nm and beyond) faces some newly-discovered challenges. There are particular bottlenecks happened on circuits incorporating microelectronic components such as transistors, amplifiers and current mirrors at deep-submicron levels. As process scaling advances further, these challenges and limitations will become more significant to the advance process of IC manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
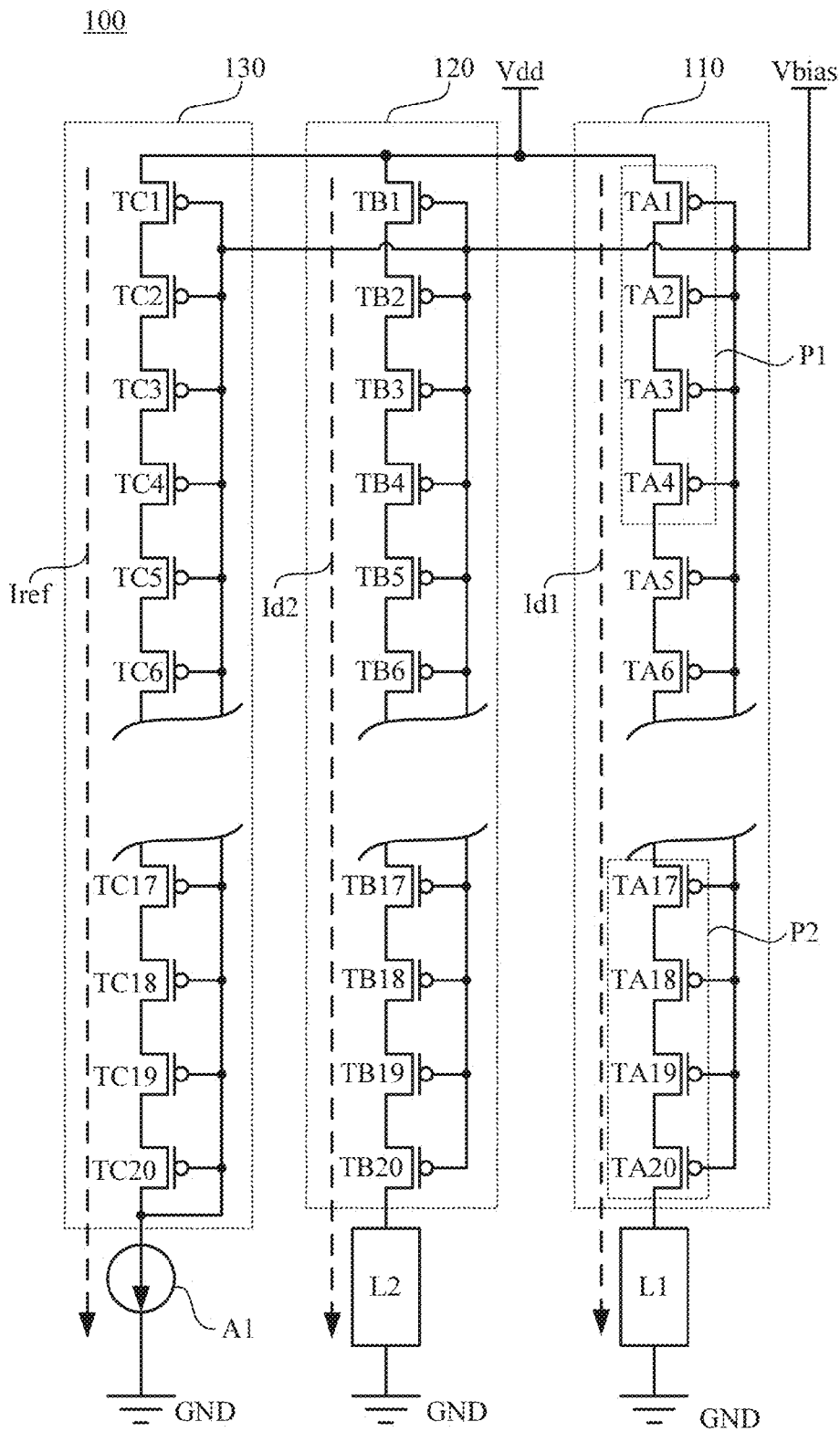
FIG. 1 is a schematic diagram illustrating an integrated circuit in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As integrated circuit (IC) manufacturing process scales down (e.g., 32 nm, 20 nm, 16 nm or beyond), size parameters of electronic components (e.g., transistors) are limited to really small. Therefore, metal-oxide-semiconductor field-effect transistors (MOSFET) with long channel lengths are no longer allowed in the advance process. However, MOSFET with long channel lengths are needed in some analog circuit design for improving their performances/characteristics, such as an output resistance (Rout) or a current mismatch within a current mirror circuit.

Plural stages of transistors (e.g., MOSFET) with small channel length in some embodiments of this disclosure are stacked together to form one equivalent transistor with a long channel length. Reference is made to FIG. 1, which is a schematic diagram illustrating an integrated circuit 100 in accordance with some embodiments. As shown in FIG. 1, the integrated circuit 100 includes plural first transistors TA1~TA20, plural second transistors TB1~TB20 and plural third transistors TC1~TC20. In embodiments shown in FIG. 1, the integrated circuit 100 has a structure of a current mirror circuit for demonstration.

The current mirror circuit includes two or more current mirror legs. A reference current is determined by an active device (e.g., a current source) on one current mirror leg. The current mirror circuit is utilized to generate current(s) with an identical magnitude (mirrored from the reference current) on other mirror legs. The current mirror circuit (e.g., the integrated circuit 100) shown in FIG. 1 includes three current mirror legs 110, 120 and 130. A reference current Iref is determined by a current source A1 on the current mirror leg 130. The current mirror circuit is configured to duplicate/mirror currents with the identical magnitude onto the current mirror legs 110 and 120, so as to drive the loads L1 and L2. In ideal cases, both of the first current Id1 through the current mirror leg 110 and the second current Id2 through the current mirror leg 120 shall be equal to the reference current Iref. However, due to process variations, the characteristics (e.g., channel length, device size, threshold voltage, etc) of the transistors between different current mirror legs 110~130 will not perfectly the same, such that a current mismatch will exist between the reference current Iref, the first current Id1 and the second current Id2.

In analog circuit operation, a current mismatch in the current mirror majorly comes from unequal threshold voltage. The current mismatch $$\left(\frac{\Delta I_D}{I_D}\right)$$

between two current mirror legs is inversely proportional to channel length (L) of the transistor on the current mirror legs, as follows:

$$\frac{\Delta I_D}{I_D} \approx \frac{1}{L}$$

Therefore, in some cases, each current mirror leg implements one transistor with long channel length to reduce the current mismatch. However, the transistor with long channel length is not suitable for advance processes.

In some embodiments of this disclosure, the current mirror leg 110 includes first transistors TA1~TA20. The transistors TA1~TA20 are electrically connected in series between a first reference terminal and a second reference terminal and with their respective gates tied together. As embodiments shown in FIG. 1, the first transistors TA1~TA20 are p-channel metal-oxide-semiconductor field-effect transistors (p-MOSFET), and the first reference terminal is a positive supply voltage terminal Vdd, and the second reference terminal is a system ground terminal GND. In some other embodiments, the first transistors TA1~TA20 are not limited to utilize the p-MOSFETs.

As shown in FIG. 1, the current mirror leg 110 includes 20 stages of first transistors TA1, TA2, TA3 . . . and TA20. One end of the first transistor TA1 at the $1^{st}$ stage is connected to the positive supply voltage terminal Vdd, and another end of the first transistor TA1 is connected to one end of the first transistor TA2 at the $2^{nd}$ stage. Another end of the first transistor TA2 at the $2^{nd}$ stage is connected to one end of the first transistor TA3 at the $3^{rd}$ stage, and so on. At least, one end of the first transistor TA20 at the $20^{th}$ stage is connected to one end of the first transistor TA19 at the $19^{th}$ stage, and another end of the first transistor TA20 at the $20^{th}$ stage is connected to the system ground terminal GND. In addition, all gates of first transistors TA1~TA20 are controlled by a bias voltage Vbias. Based on aforesaid connections between the first transistors TA1~TA20, the gate-stacked first transistors TA1~TA20 are equivalent to a singular transistor. In some embodiments, the first transistors TA1~TA20 with relatively short channel lengths (e.g., 0.1 μm, each) are equivalent to the singular transistor with a relatively long channel lengths (e.g., 2 μm).

Similarly, the current mirror leg 120 includes 20 stages of the second transistors TB1, TB2, TB3 . . . and TB20. The second transistors TB1~TB20 electrically connected in series between the positive supply voltage terminal Vdd and the system ground terminal GND. The gates of the second transistors TB1~TB20 are tied/connected together and also controlled by the bias voltage Vbias. Based on the connections between the second transistors TB1~TB20, the gate-stacked second transistors TB1~TB20 are equivalent to a singular transistor. In some embodiments, the second transistors TB1~TB20 with relatively short channel lengths are equivalent to the singular transistor with a relatively long channel lengths.

Similarly, the current mirror leg 130 also includes 20 stages of the third transistors TC1, TC2, TC3 . . . and TC20. The detail of the gate-stacked structure of the current mirror leg 130 is similar to the current mirror leg 110 and not repeated here.

In other words, an equivalent transistor with the long channel length can be achieved by stacking plural transistors each with a specific channel length allowed in the advance processes. Based on aforesaid gate-stacking structure, each of the current mirror leg 110, 120 or 130 include the equivalent transistors with long channel lengths, such that the mismatch between the reference current Iref, the first current Id1 and the second current Id2 will be reduced accordingly.

Figure 2:
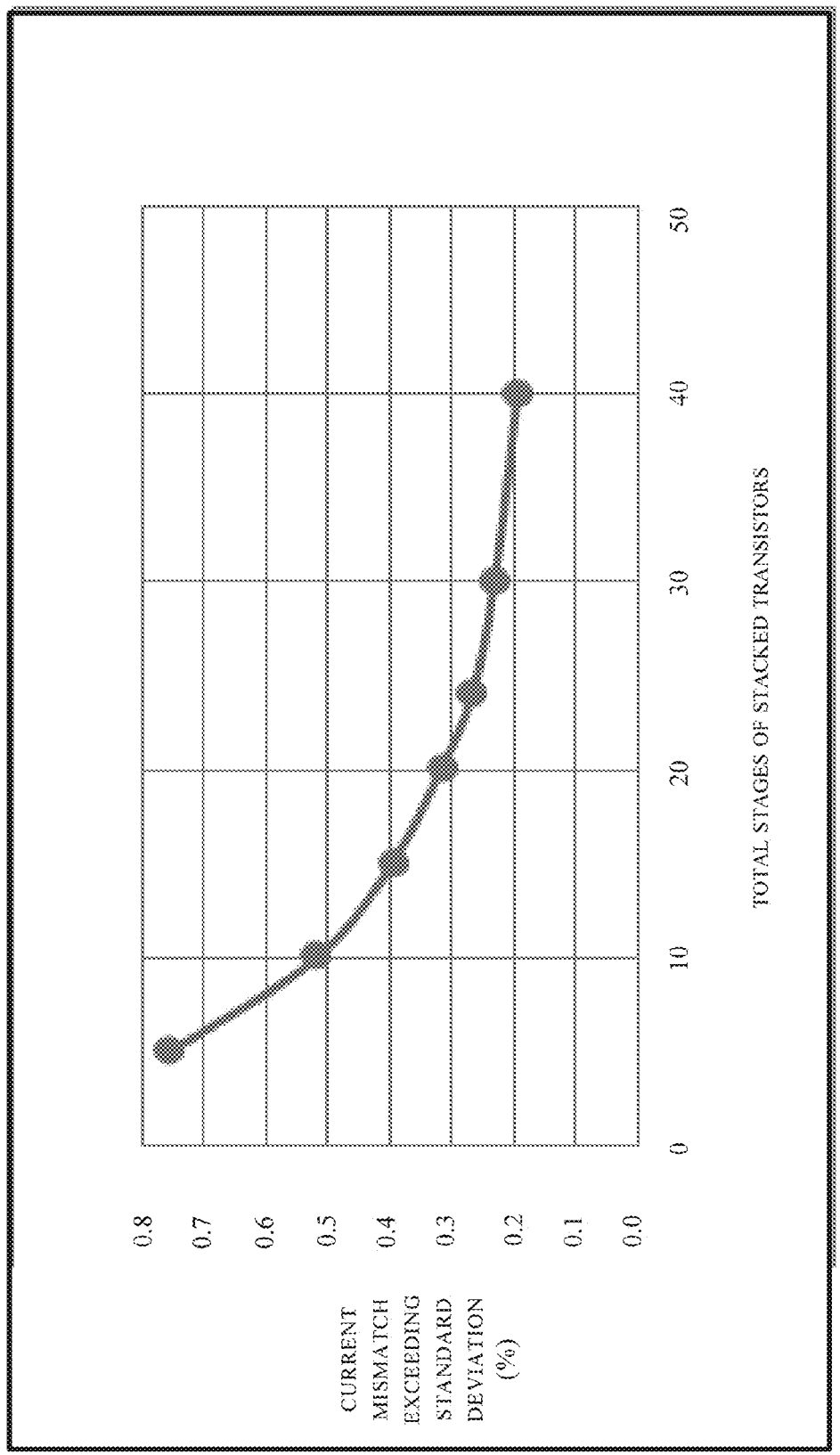
FIG. 2 is a schematic diagram illustrating a simulation result of a relationship between percentages of the current mismatch exceeding one standard deviation (σ) and total stage numbers of the stacked transistors.

Reference is made to FIG. 2, which is a schematic diagram illustrating a simulation result of a relationship between percentages of the current mismatch exceeding one standard deviation (σ) and total stage numbers of the stacked transistors. The simulation shown in FIG. 2 is performed under a bias current at 20 uA for all stack gates with different stack number; the transistors within the current mirror keep the same area for different configurations in length and width.

As shown in FIG. 2, mismatch of current-mirror is strongly correlated to the total stage numbers of the current mirror. When the stack gate number is increased, the mismatch of the current mirror circuit is reduced accordingly.

In embodiments shown in FIG. 1, the integrated circuit 100 includes three current mirror legs 110~130, and each current mirror leg 110~130 includes 20 stages of the transistors. However, each current mirror leg is not limited to include 20 stages of transistor. In some embodiments, each current mirror leg includes N stages of transistor. N is a positive integer.

Furthermore, the integrated circuit is not limited to include three current mirror legs. In some embodiments, the integrated circuit includes two or more current mirror legs (depending on the amount of loads).

Figure 3:
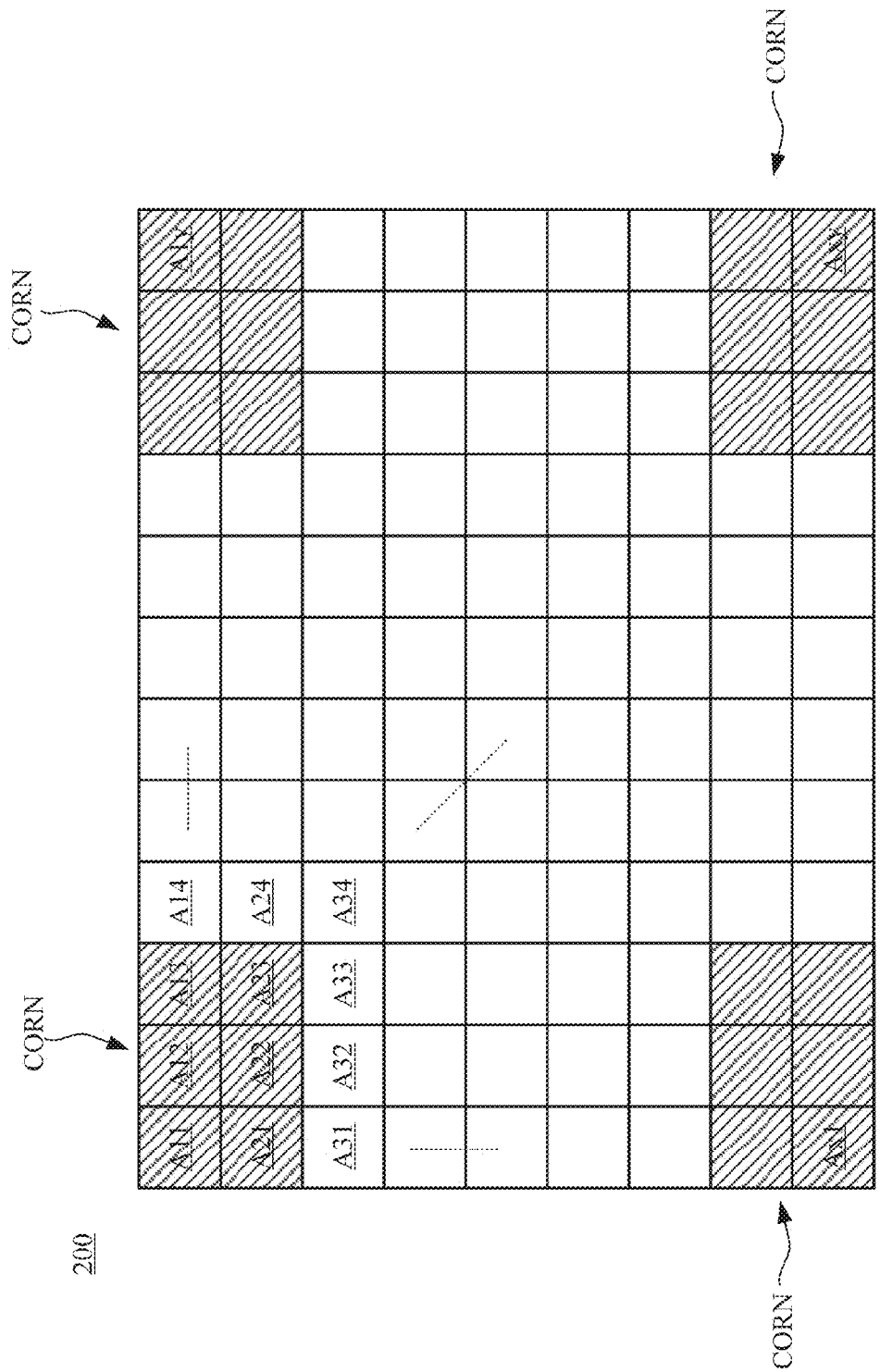
FIG. 3 is a schematic diagram illustrating a transistor array where the first transistors, the second transistor and the third transistors are implemented in accordance with some embodiments.

In some embodiments, the first transistors TA1~TA20, the second transistor TB1~TB20 and the third transistors TC1~TC20 are implemented within a transistor array. Reference is also made to FIG. 3, which is a schematic diagram illustrating a transistor array 200 where the first transistors TA1~TA20, the second transistor TB1~TB20 and the third transistors TC1~TC20 are implemented in accordance with some embodiments. As shown in FIG. 3, the transistor array 200 includes x*y (x rows *y columns) array cells A11, A12, A13 . . . and Axy, in which x, y are positive integers.

The array cells are arranged side-by-side to form a grid structure. Each of the first transistors TA1~TA20, the second transistor TB1~TB20 and the third transistors TC1~TC20 is implemented within one of the array cells A11~Axy within the transistor array 200. In some embodiment, the transistor array 200 in a rectangle shape, and there are four corner regions CORN are located around four corners (i.e., the upper left corner, the upper right corner, the bottom left corner and the bottom left corner) of the transistor array 200. Each corner region CORN covers several array cells on at least one column and at least one row started from the corresponding corner. In embodiments shown in FIG. 3, the corner region CORN at the upper left corner covers the array cells A11, A12, A13, A21, A22 and A23 (i.e., a sub-array consisting of 2*3 cells).

When the first transistors TA1~TA20, the second transistor TB1~TB20 and the third transistors TC1~TC20 in FIG. 1 are implemented in practical processes, some manufacturing variations will existed between each individual transistor, such that the characteristics of the transistors will be slightly different. When the first transistors TA1~TA20, the second transistor TB1~TB20 and the third transistors TC1~TC20 are implemented within the transistor array 200, the transistors implemented around edges of the transistor array 200 will suffer more severe manufacturing variations in comparison to the transistors implemented around the center of the transistor array 200. Especially, the transistors implemented at the corner regions CORN will be most severe over the transistor array 200.

Figure 4:
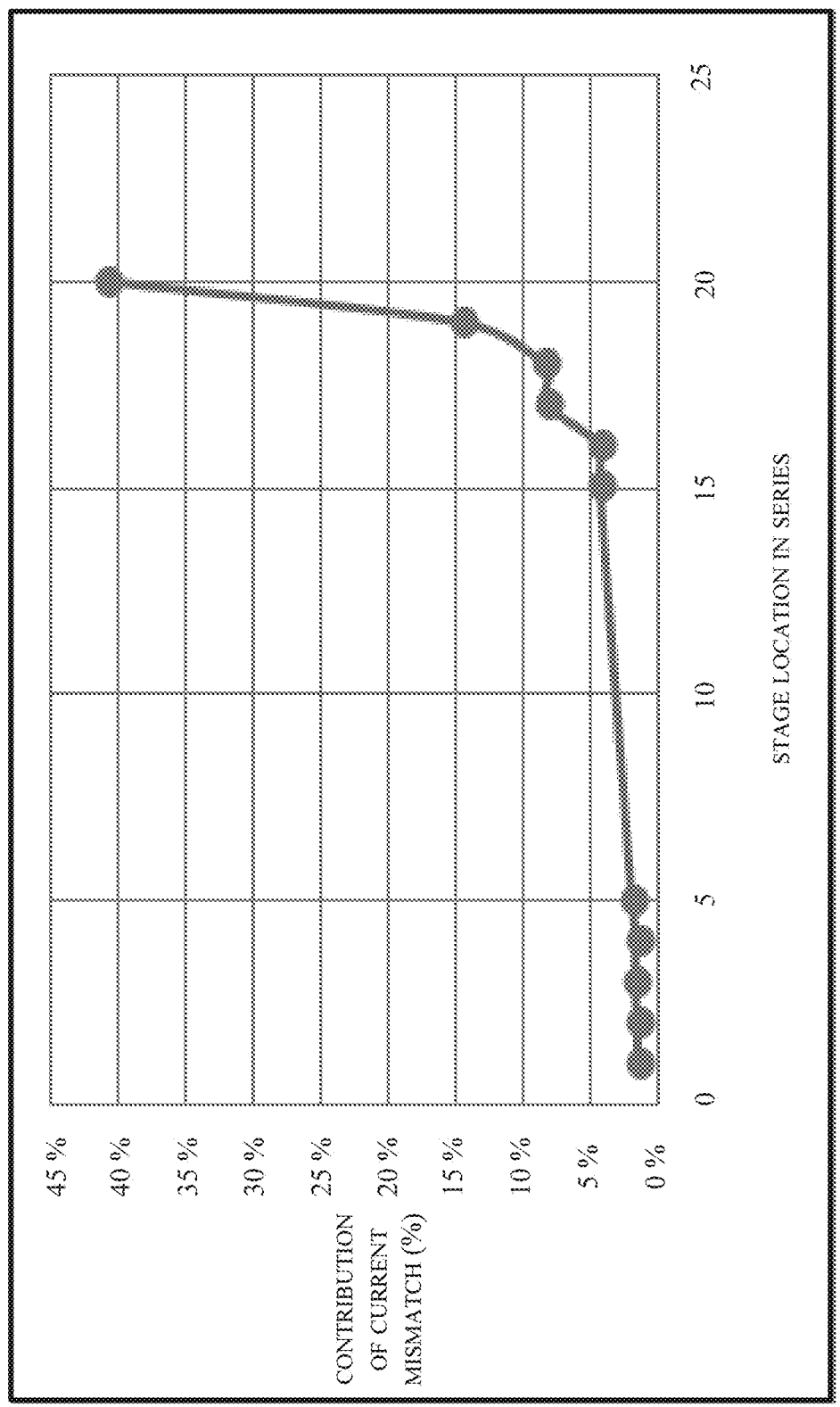
FIG. 4 is a schematic diagram illustrating a relationship between a contribution of current mismatch (%) and a stage location of a transistor in series in accordance with some embodiments.

In some embodiments, a non-dominator part of the first transistors TA1~TA20, the transistor TB1~TB20 and the third transistors TC1~TC20 are implemented at corner regions CORN of the transistor array 200. Reference is also made to FIG. 4, which is a schematic diagram illustrating a relationship between a contribution of current mismatch (%) and a stage location of a transistor in series in accordance with some embodiments. As shown in FIG. 4, when a specific manufacturing variation occurs to each of the transistors, the transistors at different stages are not equally weighted for current-mirror mismatch. In simulation shown in FIG. 4, the transistors at the last four stages (e.g., the first transistor TA17~TA20 shown in FIG. 1) in the current mirror contribute around 72% of total mismatch. Therefore, the transistors at the $1^{st}$ stage to the $16^{th}$ stage are relatively considered as non-dominator transistor for current mismatch in the current mirror circuit.

In some embodiments, the dominator part and the non-dominator part are determined according to how much the transistors under the manufacturing variation contribute to relative weights for the current-mirror mismatch. The dominator part is related to the transistors which affect the current-mirror mismatch significantly or obviously. The non-dominator part is related to the transistors which do not affect the current-mirror mismatch or affect the current-mirror mismatch slightly.

In other words, the first transistors at the last J stages TA17~TA20 (J=4 in this example) adjacent to the system ground terminal GND are considered as a dominator part P2 for current mismatch. On the other hand, another part of first transistors (e.g., the non-dominator part P1 including the first transistor TA1~TA4), which is adjacent to the positive supply voltage terminal Vdd as embodiments shown in FIG. 1, is considered as non-dominator transistors for current mismatch. The positive supply voltage terminal Vdd is also regarded as a source side relative to the p-MOSFET.

In order to avoid the severe manufacturing variations occur to the dominator transistors, the dominator part P2 including the first transistor TA17~TA20 of the last J stages (J=4 in this example) are avoided to be implemented at the corner regions CORN of the transistor array 200 shown in FIG. 3. In some embodiments, the dominator part P2 including the first transistor TA17~TA20 are implemented around the center of the transistor array 200. On the other hand, the non-dominator part P2 including the first transistor TA1~TA4 of the first K stages (K=4 in this example) are implemented at the corner regions CORN of the transistor array 200 shown in FIG. 1. In aforesaid embodiments, J and K are equal to 4, but the disclosure is not limited thereto. J and K are positive integer less than total stages, i.e., N.

Similarly, a part of the second transistors TB1~TB4 at the $1^{st}$ stage to the $4^{th}$ stage adjacent to the positive supply voltage terminal Vdd is the non-dominator part for affecting the mismatch between the first current Id1, the second current Id2 and the reference current Iref, in comparison to another part of second transistors TB16~TB20 at the $17^{th}$ stage to the $20^{th}$ stage adjacent to the system ground terminal GND. The second transistors TB1~TB4 are implemented in the corner regions CORN of the transistor array 200 along with the transistors TA1~TA4. In addition, the third transistors TC1~TC4 are also implemented in the corner regions CORN of the transistor array 200 along with the transistors TA1~TA4 and TB1~TB4.

Based on aforesaid embodiments, the non-dominator part of the transistors are implemented at the regions with most manufacturing variations, such that the whole area (e.g., every cell units) within the transistor array 200 is utilized for implementing transistors, such that no area within the transistor array 200 will be wasted. The integrated circuit 100 in some embodiments implements no dummy transistor within the transistor array 200.

Figure 5:
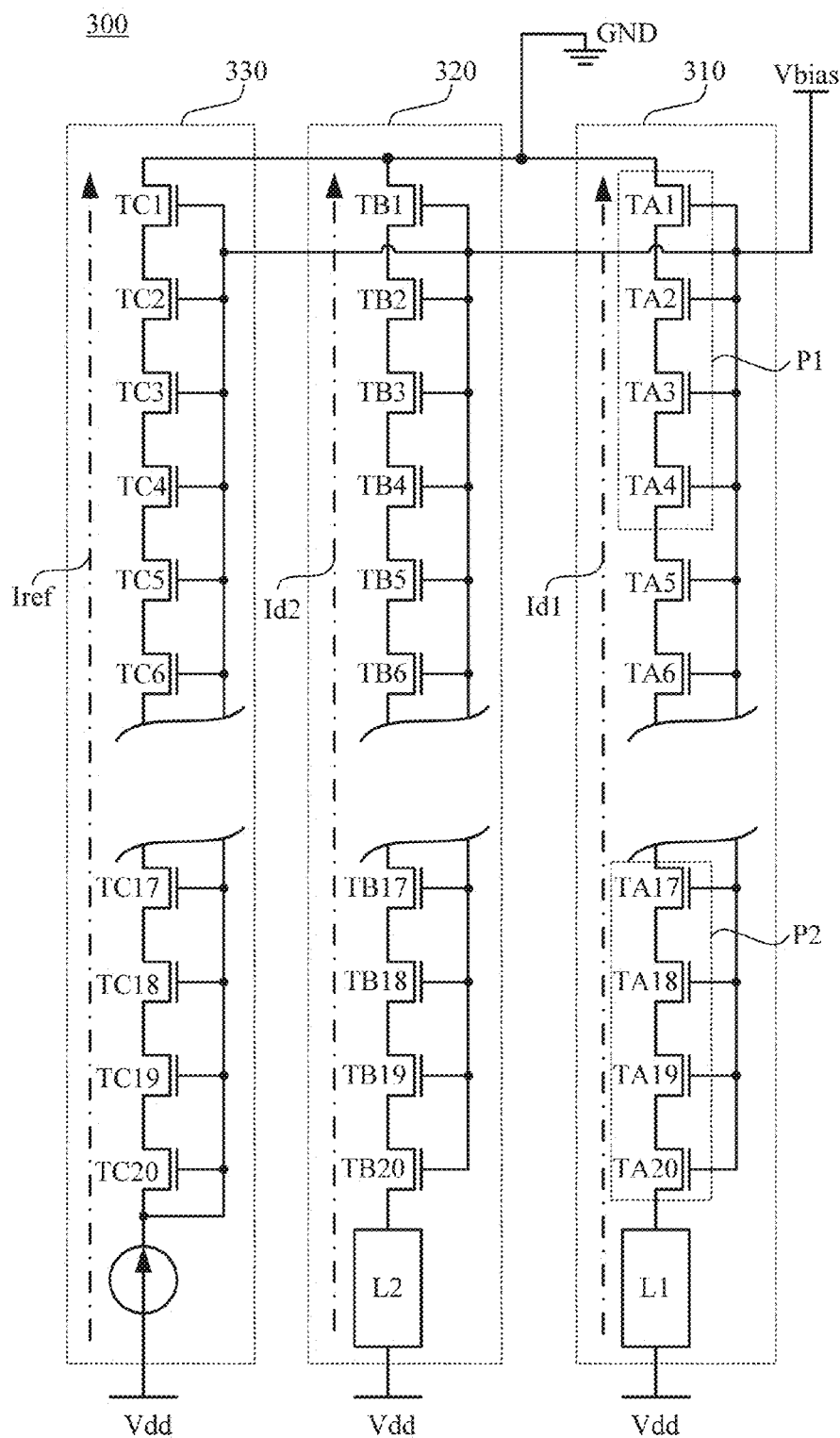
FIG. 5 is a schematic diagram illustrating an integrated circuit in accordance with some embodiments.

In aforesaid embodiments shown in FIG. 1, the transistors TA1~TA20, TB1~TB20 and TC1~TC20 are implemented by p-channel metal-oxide-semiconductor field-effect transistors (p-MOSFET). However, the disclosure is not limited thereto. In some other embodiments, the transistors can be replaced by n-channel metal-oxide-semiconductor field-effect transistors (n-MOSFET) or any equivalent transistor units. Reference is also made to FIG. 5, which is a schematic diagram illustrating an integrated circuit 300 in accordance with some embodiments.

In embodiments shown in FIG. 5, the integrated circuit 300 includes first transistors TA1~TA20, second transistors TB1~TB20 and third transistor TC1~TC20. The main difference from the integrated circuit 100 shown in FIG. 1 is that, the transistors TA1~TA20, second transistors TB1~TB20 and third transistor TC1~TC20 in FIG. 5 are implemented by n-MOSFET. The first transistors TA1~TA20 are electrically connected in series between a first reference terminal and a second reference terminal. In some embodiments implemented by n-MOSFET, the first reference terminal is the system ground terminal GND, and the second reference terminal is the positive supply voltage terminal Vdd. The alternative designs implemented by p-MOSFET (referring to embodiments shown in FIG. 1) and n-MOSFET (referring to embodiments shown in FIG. 5) are well known by a person in related art.

In embodiments implemented by n-MOSFET, a non-dominator part P1 of the first transistors TA1~TA20 is located at the first K stages (e.g., TA1~TA4 at the $1^{st}$ stage to the $4^{th}$ stage) adjacent to the system ground terminal GND, which is regarded as the source side related to the n-MOSFET. The non-dominator part P1, e.g., the first transistors TA1~TA4, are implemented at the corner regions CORN of the transistor array 200 shown in FIG. 3. On the other hands, a dominator part P2 of the first transistors TA1~TA20 is located at the last J stages (e.g., TA17~TA20 at the $17^{th}$ stage to the $20^{th}$ stage) adjacent to the positive supply voltage terminal Vdd. The dominator part P2, e.g., the first transistors TA17~TA20, are implemented around the center of the transistor array 200 shown in FIG. 3.

Similarly, non-dominator parts of the second transistors TB1~TB4 and the third transistors TC1~TC4 at the first K stages (e.g., $1^{st}$ stage to $4^{th}$ stage) adjacent to the system ground terminal GND are implemented at the corner regions CORN. Details of connections and behaviors of the integrated circuit 300 are substantial similar to the integrated circuit 100 shown in FIG. 1 and described in aforesaid paragraphs, and not repeated here.

Figure 6:
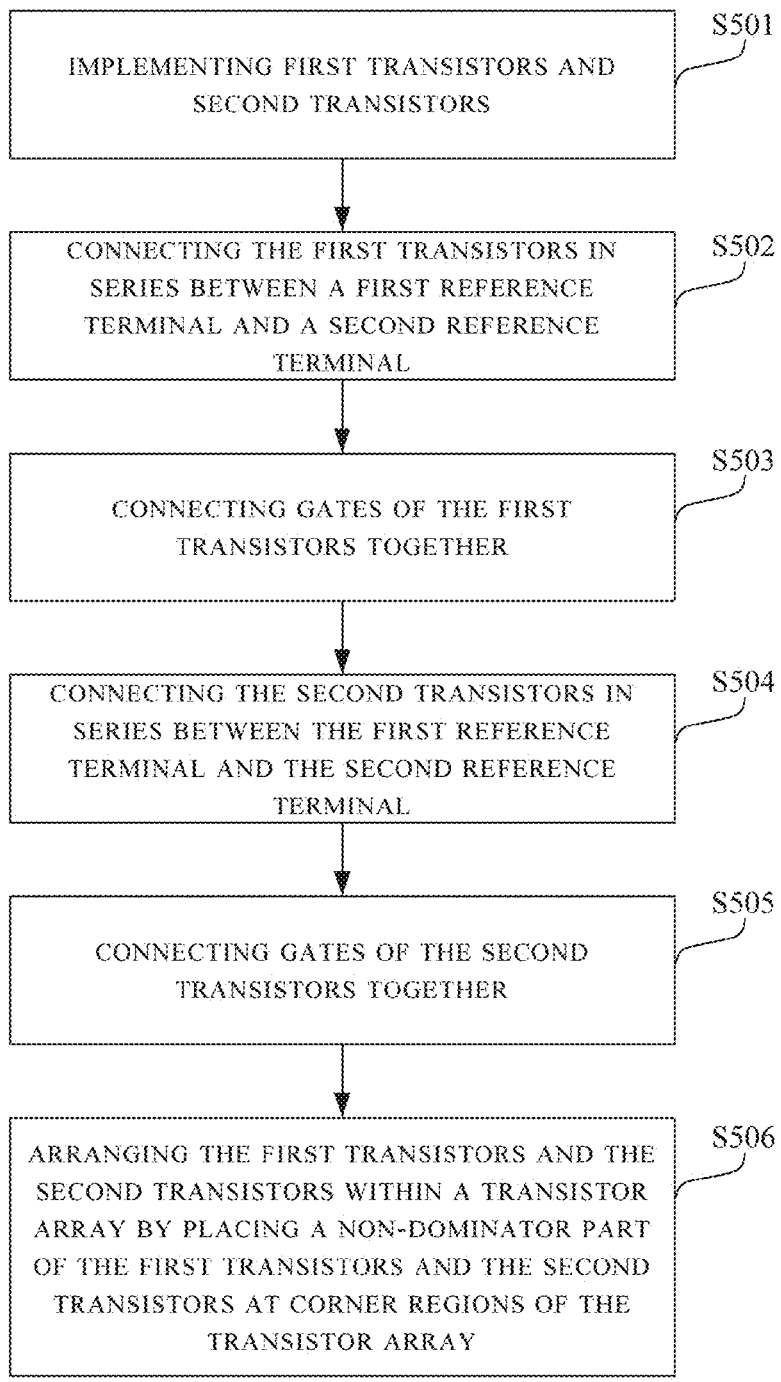
FIG. 6 is a flow chart diagram illustrating a layout method in accordance with some embodiments.

Reference is also made to FIG. 6, which is a flow chart diagram illustrating a layout method 500 in accordance with some embodiments. The layout method 500 include following operations. At first, operation 5501 is performed for implementing a plurality of first transistors and a plurality of second transistors. Operation 5502 is performed for connecting the first transistors in series between a first reference terminal and a second reference terminal (also referring to FIG. 1 or FIG. 5). Operation 5503 is performed for connecting gates of the first transistors together. Operation 5504 is performed for connecting the second transistors in series between the first reference terminal and the second reference terminal. Operation 5505 is performed for connecting gates of the second transistors together. Operation 5506 is performed for arranging the first transistors and the second transistors within a transistor array. According to the operation 5506 in some embodiments, a non-dominator part of the first transistors and the second transistors adjacent to the first reference terminal are arranged at corner regions of the transistor array (also referring to FIG. 1/FIG. 5 and FIG. 3).

Based on aforesaid descriptions, multiple transistors are stacked to form an equivalent transistor with a long channel length, such that a current mismatch can be reduced in some embodiments. Furthermore, the non-dominator part of the transistors are implemented at the regions with most manufacturing variations, such that the whole area (e.g., every cell units) within the transistor array is utilized for implementing transistors, such that no area within the transistor array will be wasted. The integrated circuit in some embodiments implements no dummy transistor within the transistor array.

Some embodiments of this disclosure provide an integrated circuit, which includes a plurality of transistors. The transistors are electrically connected in series and with their respective gates tied together. The transistors are implemented within a transistor array. The transistors are electrically connected between a first reference terminal and a second reference terminal. A non-dominator part of the transistors adjacent to the first reference terminal are implemented at corner regions of the transistor array.

Some embodiments of this disclosure provide a current mirror circuit, which includes a first current mirror leg and a second current mirror leg. The first current mirror leg is configured with N stages of first transistors electrically connected in series and with their respective gates tied together. The second current mirror leg is configured with N stages of second transistors electrically connected in series and with their respective gates tied together. The first transistors and the second transistors are implemented within a transistor array. The first transistors and the second transistors are electrically connected between a first reference terminal and a second reference terminal. The first transistors and the second transistors at $1^{st}$ to $K^{th}$ stages adjacent to the first reference terminal are implemented at corner regions of the transistor array. In aforesaid embodiments, N and K are positive integers and K<N.

Some embodiments of this disclosure provide a layout method, which includes following steps. A plurality of first transistors and a plurality of second transistors are implemented. The first transistors are connected in series between a first reference terminal and a second reference terminal. Gates of the first transistors are connected together. The second transistors are connected in series between a first reference terminal and a second reference terminal. Gates of the second transistors are connected together. The first transistors and the second transistors are arranged within a transistor array. In these embodiments, a non-dominator part of the first transistors and the second transistors adjacent to the first reference terminal are arranged at corner regions of the transistor array.

In this document, the term "coupled" may also be termed as "electrically coupled", and the term "connected" may be termed as "electrically connected". "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a plurality of first transistors electrically coupled in series and with their respective gates tied together, wherein each of the first transistors has a first channel length, the first transistors are implemented within a transistor array, the first transistors are electrically coupled between a first reference terminal and a second reference terminal, a non-dominator part of the first transistors adjacent to the first reference terminal are implemented at corner regions of the transistor array,
   wherein the first transistors electrically coupled in series and with their respective gates tied together are equivalent to a singular transistor, which has a second channel length longer than the first channel length.

2. The integrated circuit of claim 1, wherein the first transistors are p-channel metal-oxide-semiconductor field-effect transistors.

3. The integrated circuit of claim 1, further comprising:
   a plurality of second transistors electrically coupled in series and with their respective gates tied together,
   wherein the second transistors are also implemented within the transistor array, the second transistors are electrically coupled between the first reference terminal and the second reference terminal, a non-dominator part of the second transistors adjacent to the first reference terminal are also implemented at the corner regions of the transistor array.

4. The integrated circuit of claim 3, wherein each of the second transistors has a third channel length, and the second transistors electrically coupled in series and with their respective gates tied together are equivalent to a singular transistor, which has a fourth channel length longer than the third channel length.

5. The integrated circuit of claim 3, wherein a first current and a second current pass through the first transistors in series and the second transistors in series respectively, a part of the first transistors adjacent to the first reference terminal is the non-dominator part for affecting a mismatch between the first current and the second current in comparison to another part of the first transistors adjacent to the second reference terminal.

6. The integrated circuit of claim 5, wherein a part of the second transistors adjacent to the first reference terminal is the non-dominator part for affecting the mismatch between the first current and the second current in comparison to another part of the second transistors adjacent to the second reference terminal.

7. The integrated circuit of claim 1, wherein the transistor array is formed in a rectangle shape, and the corner regions are located adjacent to four corners of the transistor array.

8. The integrated circuit of claim 7, wherein the first transistors electrically coupled in series and with their respective gates tied together are equivalent to a singular transistor, which has a second channel length longer than the first channel length.

9. The integrated circuit of claim 7, further comprising:
   a plurality of second transistors electrically coupled in series and with their respective gates tied together,
   wherein the second transistors are also implemented within the transistor array, the second transistors are electrically coupled between the first reference terminal and the second reference terminal, a non-dominator part of the second transistors adjacent to the first reference terminal are also implemented at the corner regions of the transistor array.

10. The integrated circuit of claim 9, wherein each of the second transistors has a third channel length, and the second transistors electrically coupled in series and with their respective gates tied together are equivalent to a singular transistor, which has a fourth channel length longer than the third channel length.

11. The integrated circuit of claim 9, wherein a first current and a second current pass through the first transistors in series and the second transistors in series respectively, a part of the first transistors adjacent to the first reference terminal is the non-dominator part for affecting a mismatch between the first current and the second current in comparison to another part of the first transistors adjacent to the second reference terminal.

12. The integrated circuit of claim 11, wherein a part of the second transistors adjacent to the first reference terminal is the non-dominator part for affecting the mismatch between the first current and the second current in comparison to another part of the second transistors adjacent to the second reference terminal.

13. The integrated circuit of claim 1, wherein there is no dummy transistor implemented within the transistor array.

14. The integrated circuit of claim 13, wherein the first transistors electrically coupled in series and with their respective gates tied together are equivalent to a singular transistor, which has a second channel length longer than the first channel length.

15. The integrated circuit of claim 13, wherein the transistor array is formed in a rectangle shape, and the corner regions are located adjacent to four corners of the transistor array.

16. The integrated circuit of claim 13, further comprising:
a plurality of second transistors electrically coupled in series and with their respective gates tied together,
wherein the second transistors are also implemented within the transistor array, the second transistors are electrically coupled between the first reference terminal and the second reference terminal, a non-dominator part of the second transistors adjacent to the first reference terminal are also implemented at the corner regions of the transistor array.

17. The integrated circuit of claim 16, wherein each of the second transistors has a third channel length, and the second transistors electrically coupled in series and with their respective gates tied together are equivalent to a singular transistor, which has a fourth channel length longer than the third channel length.

18. The integrated circuit of claim 16, wherein a first current and a second current pass through the first transistors in series and the second transistors in series respectively, a part of the first transistors adjacent to the first reference terminal is the non-dominator part for affecting a mismatch between the first current and the second current in comparison to another part of the first transistors adjacent to the second reference terminal.

19. The integrated circuit of claim 18, wherein a part of the second transistors adjacent to the first reference terminal is the non-dominator part for affecting the mismatch between the first current and the second current in comparison to another part of the second transistors adjacent to the second reference terminal.

* * * * *